United States Patent [19]

Spalti

[11] 4,405,987
[45] Sep. 20, 1983

[54] MEASURING PROCESSES AND APPARATUS FOR DETERMINING TARIFF VALUES FOR ENERGY CONSUMERS

[75] Inventor: Alfred Spalti, Zug, Switzerland

[73] Assignee: LGZ Landis & Gyr Zug AG, Zug, Switzerland

[21] Appl. No.: 158,867

[22] Filed: Jun. 12, 1980

Related U.S. Application Data

[63] Continuation-in-part of Ser. No. 973,625, Dec. 27, 1978, abandoned.

[30] Foreign Application Priority Data

Dec. 29, 1977 [CH] Switzerland ........................ 16167/77

[51] Int. Cl.³ ............................................. G06F 15/20
[52] U.S. Cl. .................................... 364/483; 364/464; 324/103 R
[58] Field of Search ........................ 364/483, 493, 464; 235/92 MT, 92 EL; 324/103 R, 142, 116; 307/31

[56] References Cited

U.S. PATENT DOCUMENTS

| | | | |
|---|---|---|---|
| 3,502,980 | 3/1970 | Baggott | 235/92 EL |
| 3,505,508 | 4/1970 | Leyde | 324/103 R |
| 3,517,310 | 6/1970 | Gates et al. | 364/464 |
| 3,522,421 | 8/1970 | Miller | 324/103 R |
| 3,652,838 | 3/1972 | Dillon et al. | 364/493 |
| 3,747,068 | 7/1973 | Bruner et al. | 364/483 |
| 4,120,031 | 10/1978 | Kincheloe et al. | 364/464 |
| 4,125,782 | 11/1978 | Pollnow, Jr. | 364/493 |
| 4,125,895 | 11/1978 | Buhlmann | 364/483 |
| 4,141,069 | 2/1979 | Fox | 364/493 |
| 4,146,923 | 3/1979 | Borkan | 364/483 |

FOREIGN PATENT DOCUMENTS 1360318  7/1974  United Kingdom ............... 364/483

*Primary Examiner*—Gary Chin
*Attorney, Agent, or Firm*—Morgan, Finnegan, Pine, Foley & Lee

[57] ABSTRACT

In a measuring process for determining a tariff value for energy consumed, fixed quantity pulses are produced by means of a pulse generator 6 associated with a consumption meter 3. Measurement values which are proportional to the reciprocal of the time intervals between the fixed quantity pulses are summed in a summing means 9. The expectation value $\bar{P}$ of the power, the quotient of the expectation value $\bar{\bar{P}}$ and the mean value $\bar{P}$ of the power, and the form factor of the load curve, are determined in an evaluation device 11, from the measurement value $Z_2$ of the summing means 9 and the measurement value $Z_1$ of the consumption meter 3. The summing means 9 and the consumption meter 3 are connected to the evaluation device 11 by way of a communication channel 10. A microprocessor may be used for determining the reciprocal.

18 Claims, 3 Drawing Figures

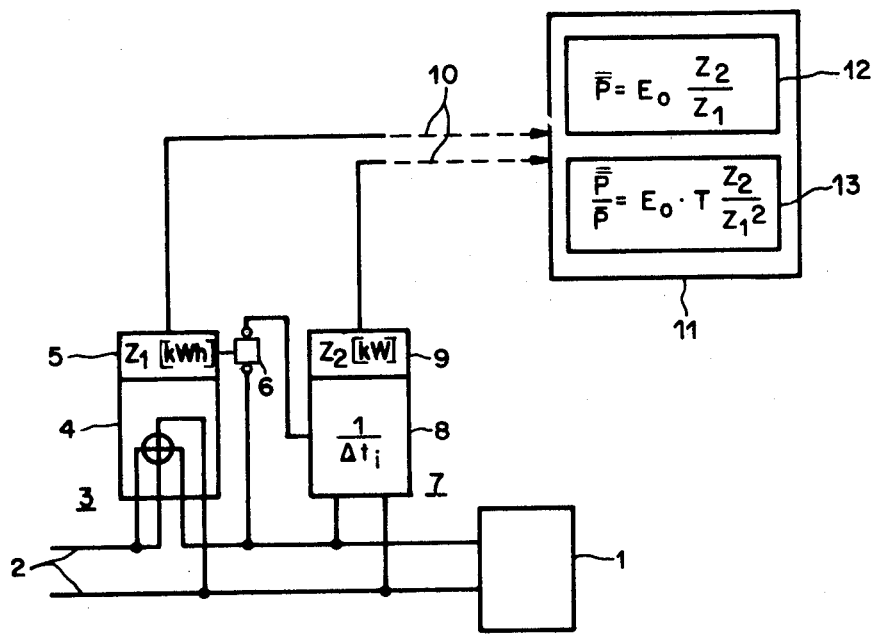
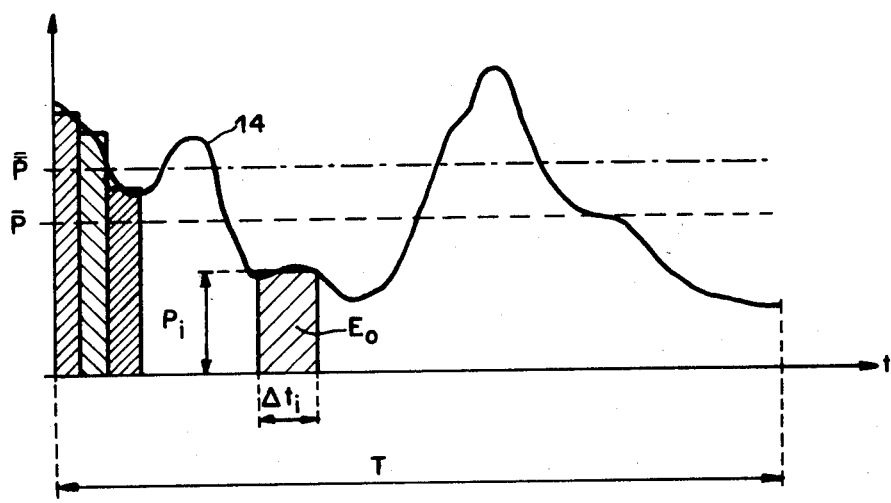

4,405,987

MEASURING PROCESSES AND APPARATUS FOR DETERMINING TARIFF VALUES FOR ENERGY CONSUMERS

CROSS-REFERENCE TO RELATED APPLICATION

This application is a continuation-in-part application of Ser. No. 973,625, filed Dec. 27, 1978, now abandoned.

BACKGROUND OF THE INVENTION

1. Field of the Invention

This invention relates to measuring processes and apparatus for determining tariff values for energy consumers.

2. Brief Description of the Patent Application

The suppliers of electrical energy endeavor to encourage energy consumers to keep to a power demand which is constant in time. In the case of large-scale consumers, this is generally done by the use of power-dependent tariffs. Tariff devices are used for determining the power demand, but to date such devices do not meet many requirements of a technical nature and of a nature related to the method of setting the tariff, and are therefore not suitable for the large number of small-scale consumers. The maximum counter and the excess-consumption counter are in the forefront of the tariff devices which are in use today. Also known are power stage indicator devices and power analyzers, as well as numerous proposals for tariff devices, which have not achieved any practical significance. A power-dependent tariff device is also known which evaluates the time interval between fixed quantity contact of an electricity meter, and which advances a summing meter in each case by an amount, for example by the reciprocal of the time interval, which is dependent on said interval, in accordance with a given function.

It is desirable that tariff setting meets the following requirements:

(1) The lowest energy cost per quantity of energy should be employed when the consumer takes the energy at a constant rate.

(2) The tariff should not be dependent either on what happens during a period of time which is very short in comparison with the entire period of calculation, or on a fixed power limit being exceeded, but should take into account what happens during the entire period of calculation.

(3) Resetting operations on tariff devices and setting limit values should be avoided.

(4) It should be possible to interrupt at any time the operation of ascertaining what is happening with regard to power.

The known tariff devices meet some of these requirements. However, no arrangement is known which simultaneously fulfills all requirements to a satisfactory extent.

SUMMARY OF THE INVENTION

According to the present invention there is provided a measuring process for determining a tariff value for energy consumers, wherein fixed quantity pulses are produced by means of a pulse generator associated with a consumption meter, each of which fixed quantity pulses represents the consumption of a predetermined fixed quantity of energy, wherein measurement values which are proportional to the reciprocal of the time intervals between the individual fixed quantity pulses are determined and are summed in a summing unit and wherein the quotient of the measurement value of the summing unit and the measurement value of the consumption meter is formed in an evaluation device.

According to the present invention there is also provided a measuring apparatus for carrying out a measuring process according to the immediately preceding paragraph, the apparatus comprising a consumption meter, a pulse generator associated therewith for producing fixed quantity pulses, a measuring and calculating unit for determining measurement values which are proportional to the reciprocal of the time intervals between the individual fixed quantity pulses, and a summing unit for summing said measurement values, the summing unit and the consumption meter being in communication with a common evaluation device by way of a communication channel.

BRIEF DESCRIPTION OF THE DRAWING

The invention will now be described by way of example with reference to the accompanying drawing, in which:

FIG. 1 is a basic diagram illustrating the principle of a measuring apparatus; and FIG. 2 is a power-time graph.

DESCRIPTION OF THE PREFERRED EMBODIMENT

Figure 3:
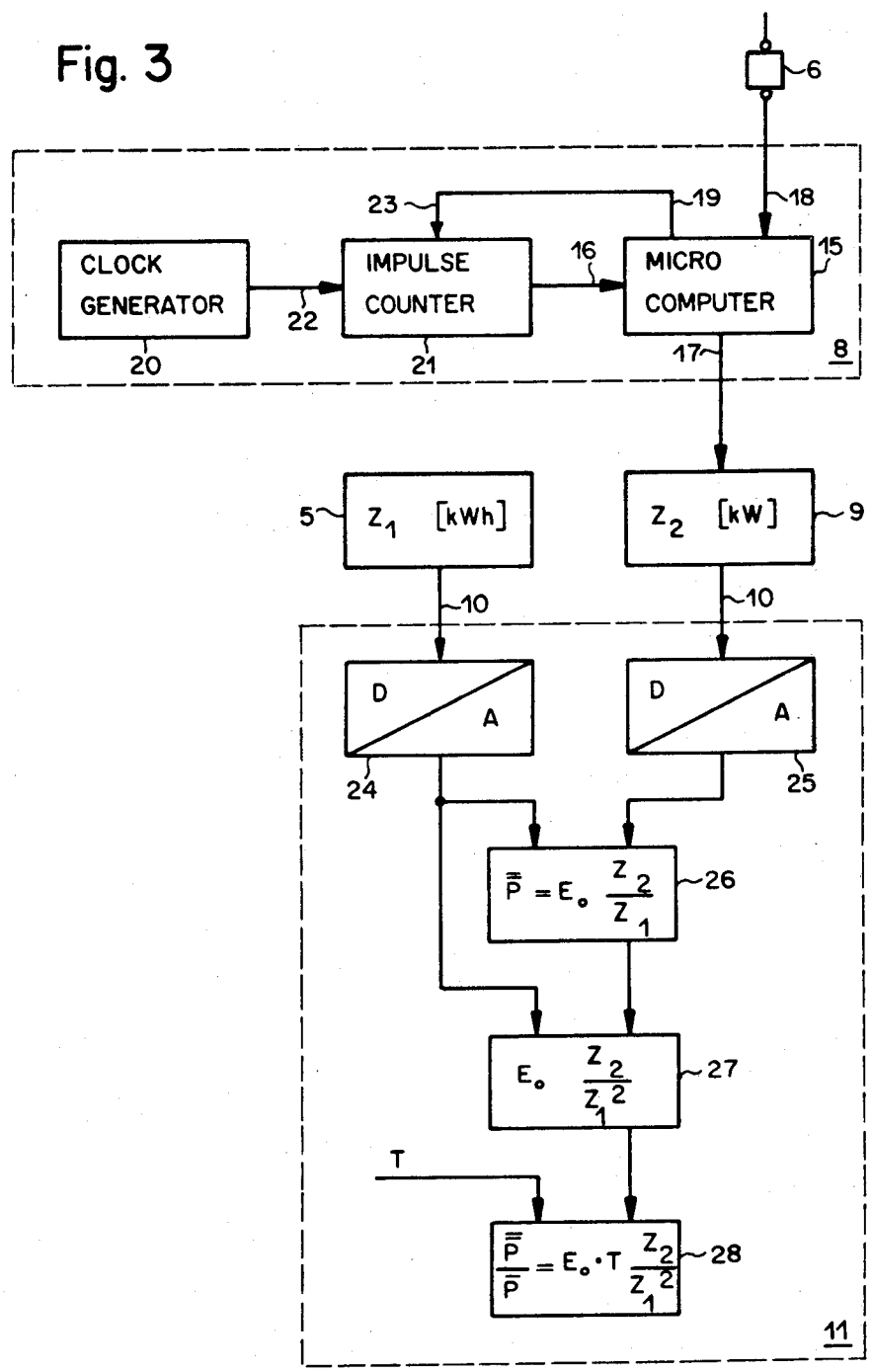
FIG. 3 is a more detailed block diagram of some of the components of the apparatus illustrated in FIG. 1.

Referring to FIG. 1, reference numeral 1 denotes a consumer which draws electrical energy from an energy distribution network 2. The energy drawn by the consumer 1 is measured with an electricity meter 3 which in conventional manner comprises a measuring mechanism 4 and a counting mechanism 5 which is calibrated in kilowatt-hours. The counting mechanism is connected to a pulse generator 6 which produces a fixed quantity pulse whenever a given fixed amount of energy, for example one kilowatt-hour, is consumed. The fixed quantity pulses control a tariff device 7 which can be structurally combined with the electricity meter 3 and which comprises a measuring and calculating unit 8 and a summing unit 9. The summing unit 9 is advantageously a counting mechanism which is calibrated in kilowatts, and is hereinafter referred to as the summing counting mechanism 9.

Whenever a fixed quantity pulse appears, the measuring and calculating unit 8 forms a measurement value which is proportional to the reciprocal of the time interval between a fixed quantity pulse and the preceding fixed quantity pulse. These measurement values are summed in the summing counting mechanism 9. The measuring and calculating unit 8 preferably comprises a microprocessor which determines the time interval between each two consecutive fixed quantity pulses, by comparison with the network frequency of the energy distribution network 2, which serves as a time base, and calculates the reciprocal of the time interval. The calculated reciprocal can be fed to a storage device, the stored content of which is discharged in fixed blocks and introduced into the summing counting mechanism 9. It will be appreciated that the above-mentioned storage device can also be omitted, and the summing counting mechanism 9 can be advanced after each fixed quantity pulse, by an amount which corresponds to the reciprocal.

The counting mechanism 5 of the electricity meter 3 and the summing and counting mechanism 9 of the tariff device 7 are in communication by way of a communication channel 10 with a common evaluation unit 11 which includes evaluation units 12 and 13. The communication channel 10 may comprise a known counter condition transmission system which transmits the counter conditions by way of the energy distribution network 2 or by way of a separate line, or the communication channel 10 may also comprise another suitable communication connection.

In FIG. 2, reference 14 denotes a load curve which illustrates what happens in regard to the power P as a function of time t over a prolonged period of calculation T. The hatched areas denote fixed quantities of energy $E_0$ which are drawn by the consumer 1 at time intervals $\Delta t_i$. The mean power within a time interval $\Delta t_i$ is denoted by $P_i$.

The following relation applies:

$$P_i = \frac{E_o}{\Delta t_i}$$

Hereinafter, the difference between the counting mechanism conditions of the electricity meter 3 at the end and at the beginning of the period of calculation T is referred to as the measurement value $Z_1$, while that with respect to the summing counting mechanism 9 is referred to as the measurement value $Z_2$. The mean value $\bar{P}$ of the power over the period of calculation may be determined from the measurement value $Z_1$ which corresponds to the energy E drawn within the period of calculation T:

$$\bar{P} = \frac{E}{T} = \frac{Z_1}{T}$$

The measurement value $Z_2$ corresponds to the accumulated values of the power $P_i$ determined over the time interval $\Delta t_i$:

$$Z_2 = \sum_{i=1}^{n} P_i$$

The number n of the accumulated $P_i$—values is known from the measurement value $Z_1$:

$$n = \frac{E}{E_o} = \frac{Z_1}{E_o}$$

From the measurement values $Z_1$ and $Z_2$ the evaluation means 12 forms the mean value $\bar{\bar{P}}$ of the $P_i$—values as:

$$\bar{\bar{P}} = \frac{Z_2}{n} = E_o \frac{Z_2}{Z_1}$$

The evaluation unit 13 forms the quotient from the mean value $\bar{\bar{P}}$ and the mean value $\bar{P}$ as:

$$\frac{\bar{\bar{P}}}{\bar{P}} = E_o \cdot T \frac{Z_2}{Z_1^2}$$

In accordance with the terminology used in mathematical statistics, the mean value $\bar{\bar{P}}$ of the $P_i$—values is to be denoted as the expectation value of the power P with respect to the power distribution. As will be shown hereinafter, this expectation value $\bar{\bar{P}}$ represents the most suitable tariff value. The quotient $\frac{\bar{\bar{P}}}{\bar{P}}$ is also highly suitable as a tariff value, for it is possible to show that:

$$\frac{\bar{\bar{P}}}{\bar{P}} = K_F^2$$

wherein $K_F$ represents the form factor of the load curve 14, that is to say, the relationship between the mean square value and the aritmetic mean value. Therefore, the form factor $K_F$ can be obtained from the display of the evaluation means 13, and the form factor is equal to one if the consumer draws his energy at constant power. In practice the form factor $K_F$ is always higher than one.

The amount K which is to be paid for the energy taken can be determined for example in accordance with the formula:

$$K = a \cdot E + b \cdot T \bar{\bar{P}} = a \cdot E \left(1 + \frac{b}{a} \cdot \frac{\bar{\bar{P}}}{\bar{P}}\right)$$

wherein a and b represents proportionality factors. The energy cost per kilowatt-hour therefore rises with an increasing value of:

$$\frac{\bar{\bar{P}}}{\bar{P}} = K_F^2$$

so that the requirement (1) above is met.

It will be readily seen that the requirement (2) above is also met, since the tariff value $\bar{\bar{P}}$ is continuously influenced by the drawing of energy over the entire period of calculation T, and no power limit values are used. Resetting of the tariff device at the beginning of a fresh period of calculation is not required, thereby also complying with requirement (3). Finally, requirement (4) above is also met because the summing operation in the tariff device 7 can be interrupted at any time, and resumed again later, without thereby causing display errors.

A particular advantage of the solution described above is that it makes it possible to determine tariff values which do not represent any arbitrarily selected functions of the power demand, but are based on laws of mathematical statistics.

The measuring and calculating unit 8, the summing and counting mechanism 9 and the evaluation unit 11 are each assembled using standard computing elements known in the art. These elements can be either digital computing elements or analog computing elements or a combination of analog and digital. One specific such combination is illustrated in FIG. 3.

Measuring and calculating unit 8 is made up of a clock generator 20, an impulse counter 21 and a micro computer 17, programmed to calculate reciprocals. The micro computer includes a control input 18, a control output 19, a data input 16 and a data output 17. Control output 19 is connected to a reset input 23 of counter 21. The counter receives pulses from clock generator 20 via an input 22. The clock generator produces pulses at constant frequency, for example, at the line frequency rate or a multiple thereof. The switch 6 associated with the watt-hour meter is connected to control input 18.

A control pulse created by momentary closure of switch 6 causes micro computer 15 to read the output count of impulse counter 21 and to calculate the reciprocal which appears on data output 17. The micro computer also provides a control signal to input 23 of the counter to reset the counter so it begins a new counting cycle. Thus, each time switch 6 is acutated, the micro computer provides a digital output indication which is the reciprocal of the number of pulses from clock generator 20 that have occurred since the prior actuation of the switch. The reciprocal can be calculated, for example, by sequential subtraction as described "SGS-ATS F8 Guide to Programming", page 10-1 to 10-5 or by other commonly used procedures.

Summing counting mechanism 9 is a conventional digital summing circuit that adds successive outputs from micro computer 15 to maintain a running total.

The evaluation unit 11, which calculate the values $$\bar{\bar{P}} = E_o \frac{Z_2}{Z_1} \text{ and } \frac{\bar{\bar{P}}}{\bar{P}} = E_o \cdot T \frac{Z_2}{Z_1^2}$$

can be constructed using digital components. In practice T is normally a constant (e.g. one month) and $E_O$ is likewise a constant and therefore these constants can be ignored in the calculations.

Another arrangement for evaluation unit 11 in which analog computing elements are utilized is shown in FIG. 3. The components include digital to analog converters 24 and 25, dividers 26 and 27 and a multiplier 28.

The counter readings $Z_1$ and $Z_2$ of the counter 5 and of the totaling counter 9 are each transferred via channel 10 to digital/analog converters 24 and 25 respectively which form the digital signals into analog measurement variables. Divider 26, is connected to receive the measurement variable $Z_2$ which is divided by the measurement variable $Z_1$ so that the quotient is a measure for the variable $\bar{P}$. (Since $E_O$ is a constant, no separate multiplication by $E_o$ is necessary for the calculating of the value $\bar{P}$).

In order to determine the value $\bar{\bar{P}}/\bar{P}$, the divider 27 and the multiplier 28 are used. Divider 27 is connected to receive the variable $\bar{P}$ from divider 26 and the measurement variable Z, from converter 24. $\bar{P}$ is divided by $Z_1$ in divider 27 and the quotient is supplied to multiplier 28 where it is multiplied by T. The variable T can be introduced into the multiplier 28 in the form of a voltage which is proportional to the charge period. Since the charge period T is normally constant in actual practice (for instance, one month) it is possible to omit the multiplier 28 entirely and to include the term T in the calculation of $\bar{\bar{P}}/\bar{P}$ as proportionality constant of the divider 27. Where multiplier 28 is utilized, as shown in FIG. 3, the product is $$\frac{\bar{\bar{P}}}{\bar{P}} = E_o \cdot T \frac{Z_2}{Z_1^2}.$$

Suitable analog multipliers are described, for example, in "Halbleiter-Schaltungs-Technik" [Semiconductor Circuit Engineering] by U. Tietze and Ch.Schenk, published by Springer-Verlag 1971, Chapter 11.16. Suitable analog dividers are described in Chapter 11.16.7 of the same book.

While only a few illustrative embodiments have been described in detail, it should be apparent that there are other embodiments within the scope of this invention.

What I claim is:

1. A measuring process for determining a tariff value for energy consumed by an energy consumer during a period of energy consumption, comprising: producing fixed quantity pulses during said energy consumption period by means of a pulse generator associated with a consumption meter measuring the energy consumed during said energy consumption period, each of which fixed quantity pulses represents the consumption of a predetermined fixed quantity of energy; determining measurement value each time a fixed quantity pulse is produced which is proportional to the reciprocal of the time intervals between said fixed quantity pulse and the immediately preceding fixed quantity pulse; summing said measurement values during said consumption period; and forming the quotient of the summed measurement values for said consumption period and the measurement value of the consumption meter for said consumption period by dividing said summed measurement values by the measurement value of said consumption meter for said consumption period, said quotient representing said tariff for said consumption period.

2. A measuring process according to claim 1 further comprising forming the expectation value of the power consumed with respect to the power distribution from the summed measurement values and the measurement value in accordance with the relationship:

$$\bar{P} = E_o \frac{Z_2}{Z_1}$$

wherein $E_o$ denotes the fixed quantity of energy represented by each pulse, $Z_1$ denotes the measurement value of the consumption meter, and $Z_2$ denotes the measurement values of the summing means.

3. A measuring process according to claim 2 wherein said quotient is formed from the expectation value of the power consumed and the mean value of the power consumed.

4. A measuring process according to claim 1, wherein the form factor of the load curve for power consumed during a period of energy consumption is formed from the summed measurement values during said energy consumption period and the measurement value measuring the energy consumed during said energy consumption period, said form factor representing said tariff value for said consumption period.

5. A measuring process according to claim 2 wherein the form factor of the load curve for power consumed during a period of energy consumption is formed from the summed measurement values during said energy consumption period and the measurement value measuring the energy consumed during said energy consumption period, said form factor representing said tariff value for said period.

6. A measuring process according to claim 3 wherein the form factor of the load curve for power consumed during a period of energy consumption is formed from the summed measurement values during said energy consumption period and the measurement value measuring the energy consumed during said energy consumption period, said form factor representing said tariff value during said consumption period.

7. A measuring apparatus for determining a tariff value for energy consumed by an energy consumer during a period of energy consumption, said tariff being dependent on the power of said energy consumed, comprising a consumption meter for measuring energy consumed during said energy consumption period, a pulse generator associated with said consumption meter for producing fixed quantity pulses each of which pulses represents the consumption of a fixed quantity of energy, a measuring and calculating means for forming measurement value each time a fixed quantity pulse is produced proportional to the reciprocal of the time intervals between said fixed quantity pulse and the immediately preceding fixed quantity pulse, a summing means for summing said measurement values during said consumption period, and an evaluation means for forming the quotient of the said summed measurement values and the measurement value for said consumption period by dividing the said summed measurement values by the said measurement value; said summing means and said consumption meter being in communication with a common evaluation means by way of communication channel, said quotient representing said tariff value for said consumption period.

8. A measuring apparatus according to claim 7 wherein the evaluation means includes means for determining the expectation value ($\bar{P}$) of the power with respect to the power distribution, in accordance with the relationship:

$$\bar{P} = E_o \frac{Z_2}{Z_1}$$

wherein $E_o$ denotes the fixed quantity of energy represented by each pulse, $Z_1$ denotes the measurement value of the consumption meter, and $Z_2$ denotes the measurement values of the summing means.

9. A measuring apparatus according to claim 7 wherein the evaluation means includes means for forming the quotient from the expectation value $\bar{P}$ of the power and the mean value $P$ of the power, in accordance with the relationship:

$$\frac{\bar{P}}{P} = E_o \cdot T \frac{Z_2}{Z_1^2}$$

wherein $E_o$ denotes the fixed quantity of energy represented by each pulse, $Z_1$ denotes the measurement value of the consumption meter, $Z_2$ denotes the measurement values of the summing means, and T denotes the duration of the measuring period.

10. A measuring apparatus according to claim 8 wherein the evaluation means includes means for forming the quotient from the expectation value $\bar{P}$ of the power and the mean value $P$ of the power, in accordance with the relationship:

$$\frac{\bar{P}}{P} = E_o \cdot T \frac{Z_2}{Z_1^2}$$

wherein $E_o$ denotes the fixed quantity of energy represented by each pulse, $Z_1$ denotes the measurement value of the consumption meter, $Z_2$ denotes the measurement values of the summing means, and T denotes the duration of the measuring period.

11. A measuring apparatus according to claim 7 wherein the summing means is a counting mechanism.

12. A measuring apparatus according to claim 8 wherein the summing means is a counting mechanism.

13. A measuring apparatus according to claim 9 wherein the summing means is a counting mechanism.

14. A measuring apparatus according to claim 10 wherein the summing means is a counting mechanism.

15. A measuring apparatus according to claim 11 wherein the measuring and calculating means comprises a microprocessor.

16. A measuring apparatus according to claim 12 wherein the measuring and calculating means comprises a microprocessor.

17. A measuring apparatus according to claim 13 wherein the measuring and calculating means comprises a microprocessor.

18. A measuring apparatus according to claim 14 wherein the measuring and calculating means comprises a microprocessor.

* * * * *